US011552640B2

(12) United States Patent
Jinno et al.

(10) Patent No.: US 11,552,640 B2
(45) Date of Patent: Jan. 10, 2023

(54) REDUNDANCY CONTROL DEVICE FOR AIRCRAFT

(71) Applicant: NABTESCO CORPORATION, Tokyo (JP)

(72) Inventors: Takayuki Jinno, Tokyo (JP); Takashi Ogawa, Tokyo (JP)

(73) Assignee: NABTESCO CORPORATION, Tokyo (JP)

(*) Notice: Subject to any disclaimer, the term of this patent is extended or adjusted under 35 U.S.C. 154(b) by 20 days.

(21) Appl. No.: 17/192,257

(22) Filed: Mar. 4, 2021

(65) Prior Publication Data

US 2021/0281265 A1 Sep. 9, 2021

(30) Foreign Application Priority Data

Mar. 9, 2020 (JP) .............................. JP2020-039939

(51) Int. Cl.
*H03K 19/23* (2006.01)
*B64C 13/50* (2006.01)
*B64C 13/42* (2006.01)
*H03K 3/037* (2006.01)
*H03K 5/24* (2006.01)

(52) U.S. Cl.
CPC ............. *H03K 19/23* (2013.01); *B64C 13/42* (2013.01); *B64C 13/505* (2018.01); *H03K 3/037* (2013.01); *H03K 5/24* (2013.01)

(58) Field of Classification Search
CPC ......... B60L 11/00; B60L 11/14; H03K 19/00; H03K 19/23; H03K 3/00; H03K 3/037; H03K 5/00; H03K 5/24; B60R 16/00; B60R 16/03; B60R 16/0315; B64C 13/00; B64C 13/42; B64C 13/505; Y02T 10/00; Y02T 10/7005; Y02T 10/7077
USPC ......................................................... 307/9.1
See application file for complete search history.

(56) References Cited

U.S. PATENT DOCUMENTS

| 2005/0162185 | A1* | 7/2005 | Satsukawa | H03K 5/135 |
| | | | | 326/35 |
| 2018/0340554 | A1* | 11/2018 | Hutchison | F15B 20/00 |
| 2019/0004515 | A1* | 1/2019 | Matsui | B64D 45/00 |

FOREIGN PATENT DOCUMENTS

JP   H01-98034 A   4/1989

* cited by examiner

*Primary Examiner* — Diana J. Cheng
*Assistant Examiner* — Dave Mattison
(74) *Attorney, Agent, or Firm* — Pillsbury Winthrop Shaw Pittman, LLP

(57) ABSTRACT

The redundancy control device includes three controllers that output status signals, a majority voting circuit to which a first voltage or a second voltage is supplied as an output signal through an output line of each controller, a switch provided in each output line, a voltage supply unit provided for each output line to supply the second voltage to the output line when the first voltage is lost, a latch circuit provided for each output line to latch the second voltage when the second voltage is supplied thereto and continue to output the second voltage, a comparison circuit provided for each controller to output a comparison signal based on a comparison of the status signals, and a switch control unit provided for each switch to outputs a switch signal to the switch in response to the comparison signal from the comparison circuit.

4 Claims, 7 Drawing Sheets

REDUNDANCY CONTROL DEVICE FOR AIRCRAFT

CROSS-REFERENCE TO RELATED APPLICATIONS

This application is based on and claims the benefit of priority from Japanese Patent Application Serial No. 2020-039939 (filed on Mar. 9, 2020), the contents of which are hereby incorporated by reference in its entirety.

TECHNICAL FIELD

The present invention relates to a redundancy control device for an aircraft.

BACKGROUND

A redundancy control device disclosed in Japanese Laid-Open Patent Publication No. 1-98034 ("the '034 Publication") includes three controllers. Identical signals are supplied to the three controllers and the three controllers are configured to output identical output signals. The output signals from the three controllers are supplied to a majority voting circuit. The majority voting circuit establishes a majority among the inputs by the three controllers and produces a final output. Even if any one of the controllers fails in such a redundancy control device, an appropriate final output can be obtained from the outputs of the other two of the controllers.

Such a redundancy control device using the technique disclosed in the '034 Publication may be used for control of various parts of an aircraft. However, if any two of the controllers fail in the redundancy control device, the reliability of the final output cannot be secured since the final output determined by majority voting changes depending on whether outputs of the two faulty controllers are identical and whether the outputs of the two faulty controllers are identical to an output of the normally working controller. To address this, a monitoring controller may be provided for each of the three controllers. The voting circuit may be configured such that, when the monitoring controller determines failure of the corresponding controller, an output of the controller is not reflected on a final output. However, such monitoring controllers have complex configurations and are prone to failures.

SUMMARY

The present invention has been made in view of the above drawback, and one object thereof is to provide a redundancy control device that produces a highly reliable output.

A redundancy control device for aircraft according to one aspect of the invention includes: three controllers each outputting a first voltage or a second voltage different from the first voltage as an output signal to an actuator that drives a moving surface of an aircraft, each of the three controllers performing a same processing to obtain an operation result, each of the three controllers outputting the operation result as a status signal; a comparison circuit provided for each of the three controllers, the comparison circuit outputting a comparison signal based on a comparison between the status signal outputted by a corresponding one of the three controllers and the status signal outputted by another of the three controllers; a switch provided for each of three output lines, each of the three controllers being provided with a corresponding one of the three output lines through which the output signal is outputted by a corresponding one of the three controllers, the switch switching between connection and disconnection of a corresponding one of the three output lines; a switch control unit provided for each switch, the switch control unit outputting a switch signal to the switch in response to the comparison signal from the comparison circuit; a voltage supply unit connected to each of the three output line downstream of the switch, the voltage supply unit supplying the second voltage to the output line when the first voltage from the controller is lost; a latch circuit connected to each of the three output lines downstream of the voltage supply unit, the latch circuit latching the second voltage and keeping outputting the second voltage once the second voltage is inputted thereto; and a majority voting circuit connected to the three output lines downstream of the latch circuits, each of the output signals from the three controllers being inputted to the majority voting circuit through each corresponding one of the output lines, the majority voting circuit establishing a majority vote of the three output signals and outputting the first voltage or the second voltage as a final output signal. The switch control unit outputs the switch signal to disconnect the switch provided in the output line of a first controller, which is a corresponding one of the three controllers, when the comparison signals outputted by the comparison circuits of second and third controllers, which are the other two of the three controllers, both indicate a mismatch between the first controller and the second and third controllers.

If the status signal of one controller does not match the status signal of the other two controllers, the controller is likely to be out of order. Therefore, in the above configuration, the switch control unit disconnects the output line when the comparison signals outputted by the comparison circuits of the other two controllers both indicate a mismatch between the corresponding controller and the other controller. In this case, the voltage supply unit supplies the second voltage to the output line, and the latch circuit latches the second voltage. The second voltage is then inputted to the majority voting circuit through the output line. In this way, when there is a high probability that the controller has failed, the second voltage is inputted to the majority voting circuit through the output line of the controller. Therefore, if two or more controllers fail, the second voltage is inputted to the majority circuit from the corresponding two or more output lines. Thus, the majority voting circuit reliably outputs the second voltage as the final output signal, and the voltage of the final output signal is reliably defined to the second voltage. In this way, when two controllers fail, a reliable output can be obtained as the final output signal without using monitoring controllers.

The redundancy control device may be applied to a plurality of fluid pressure actuators attached to a same moving surface of the aircraft, and the plurality of actuators are configured to be switched between an active mode where the actuators drive the moving surface and a standby mode where the actuators follow the moving surface without driving the moving surface.

As for the redundancy control device for an aircraft, the plurality of actuators attached to the moving surface may include one or more first actuators and one or more second actuators different from the first actuator, and one of the first actuator and the second actuator may be controlled to operate in the active mode, and the other of the first actuator and the second actuator may be controlled to operate in the standby mode.

The redundancy control device may be applied to an electromechanical actuator attached to a moving surface of the aircraft.

DESCRIPTION OF THE EMBODIMENTS

An embodiment of an actuator to which a redundancy control device for an aircraft is applied will be hereunder described with reference to the accompanying drawings.

Configurations of the actuator and its control will be now described.

Figure 1:
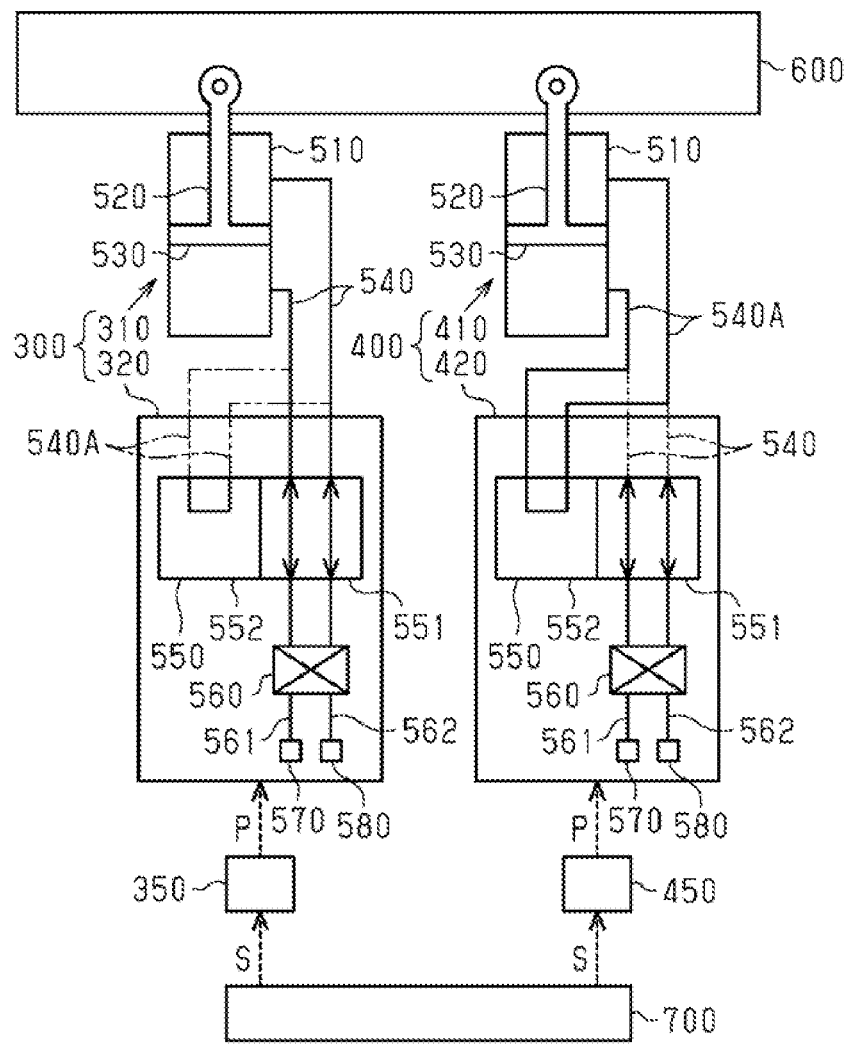
FIG. 1 is a schematic configuration diagram of an actuator and its control.

As shown in FIG. 1, a first actuator 300 and a second actuator 400 that drive a flap 600 are attached to the flap 600 of an aircraft. It should be noted that a plurality of first actuators 300 are provided, but FIG. 1 only shows one of them. The plurality of first actuators 300 all have an identical configuration. It should also be noted that a plurality of second actuators 400 are provided, but FIG. 1 only shows one of them. The plurality of second actuators 400 all have an identical configuration. The same number of the second actuators 400 as those of the first actuator 300 are provided.

The first actuator 300 is an electrohydraulic system. A main body 310 of the first actuator 300 has a tubular cylinder 510. The interior of the cylinder 510 constitutes a fluid chamber into which and from which a hydraulic fluid is fed and discharged. In the fluid chamber, a rod 520 having a columnar shape is positioned coaxially with the cylinder 510. A tip of the rod 520 protrudes out from the cylinder 510 and is attached to the flap 600. Inside the cylinder 510, a piston 530 projects from an outer peripheral surface of the rod 520. The piston 530 divides the fluid chamber into two in an axial direction of the cylinder 510.

A connection passage 540 is connected to each of the pair of fluid chambers divided by the piston 530. The pair of connection passages 540 are coupled to a mode switching valve 550 that switches a flow path of the hydraulic fluid. The mode switching valve 550 is a solenoid valve whose position is switched between a communicating position 551 and a cutoff position 552 according to a supply of electric power. When the mode switching valve 550 is switched to the communicating position, the mode switching valve 550 operates in a feeding and discharging mode. That is, one of the pair of connection passages 540 is connected to a feed passage 561 of the hydraulic oil, and the other of the connection passages 540 is connected to a discharge passage 562 of the hydraulic oil. Thus, the hydraulic oil delivered from the pump 570 is supplied to one fluid chamber through the feed passage 561, and the hydraulic oil is discharged from the other fluid chamber to a tank 580 through the discharge passage 562.

When the mode switching valve 550 is switched to the cutoff position 552, the mode switching valve 550 operates in a bypass mode. Specifically, the pair of connection passages 540A switched to the cutoff position 552 are cut off from both the feed passage 561 and the discharge passage 562. At the same time, the pair of connection passages 540A switched to the cutoff position 552 are connected to each other. As a result, the hydraulic fluid can move back and forth between the pair of fluid chambers. A connection switching valve 560 for switching connections of the feed passage 561 and the discharge passage 562 to the pair of connection passages 540 is provided in the feed passage 561 and the discharge passage 562. The connection switching valve 560, the mode switching valve 550, the feed passage 561, the discharge passage 562, and the pair of connection passages 540 form a first hydraulic circuit 320 that feeds and discharges the hydraulic fluid to the main body 310 of the first actuator 300. The first actuator 300 includes the first hydraulic circuit 320 and the main body 310.

The switching valves 550 and 560 and the pump 570 of the first hydraulic circuit 320 are controlled a first redundancy control device 350. The first redundancy control device 350 estimates values of current and the like for controlling the switching valves 550, 560 and the pump 570 based on a command signal S from an upper-level device 700, and outputs them to the first hydraulic circuit 320 as a command signal P. The upper-level device 700 is a control device that comprehensively controls various moving surfaces attached to the aircraft. As described above, the plurality of first actuators 300 are provided. These first actuators 300 are controlled by the same first redundancy control device 350 and operate synchronously.

A main body 410 of a second actuator 400 has the same configuration as the main body 310 of the first actuator 300. Hydraulic fluid is fed to and discharged from the main body 410 by a second hydraulic circuit 420 having the same configuration as the first hydraulic circuit 320. The second hydraulic circuit 420 is controlled by a second redundancy control device 450 having the same configuration as the first redundancy control device 350. For the second actuator 400, the same components as those of the first actuator 300 are designated by the same reference numerals as those of the first actuator 300, and will not be repeatedly described. As described above, the plurality of second actuators 400 are provided. These second actuators 400 are controlled by the same second redundancy control device 450 and operate synchronously.

During normal operation, the upper-level device 700 transmits the command signal S to control the first actuator 300 such that the first actuator 300 operates in an active mode in which the flap 600 is driven by the first actuator, and control the second actuator 400 such that the second actuator 400 operates in a standby mode in which the second actuator 400 stands by for a failure of the first actuator 300. Here, in the first actuator 300 controlled to operate in the active mode, the mode switching valve 550 is controlled to operate in a feed/discharge mode, and the connection switching valve 560 and the pump 570 operate according to a target position of the flap 600. In the second actuator 400 controlled to operate in the standby mode, the mode switching valve 550 is controlled to operate in the bypass mode and the pair of connection passages 540A are connected to each other. Thus, the hydraulic fluid moves back and forth between the pair of fluid chambers according to operation of the flap 600. That is, the second actuator 400 follows movement of the flap 600. As will be described later, when a failure occurs in the first redundancy control device 350, the mode switching valve 550 of the first hydraulic circuit 320 is forcibly switched to the bypass mode. That is, the first actuator 300 enters the standby mode. In this case, the upper-level device 700 controls the second actuator 400 through the second redundancy control device 450 such that the second actuator 400 operates in the active mode.

The first redundancy control device 350 and the second redundancy control device 450 will be now described in detail. The second redundancy control device 450 has the identical configuration as the first redundancy control device 350 so that the description thereof will be omitted.

Figure 2:
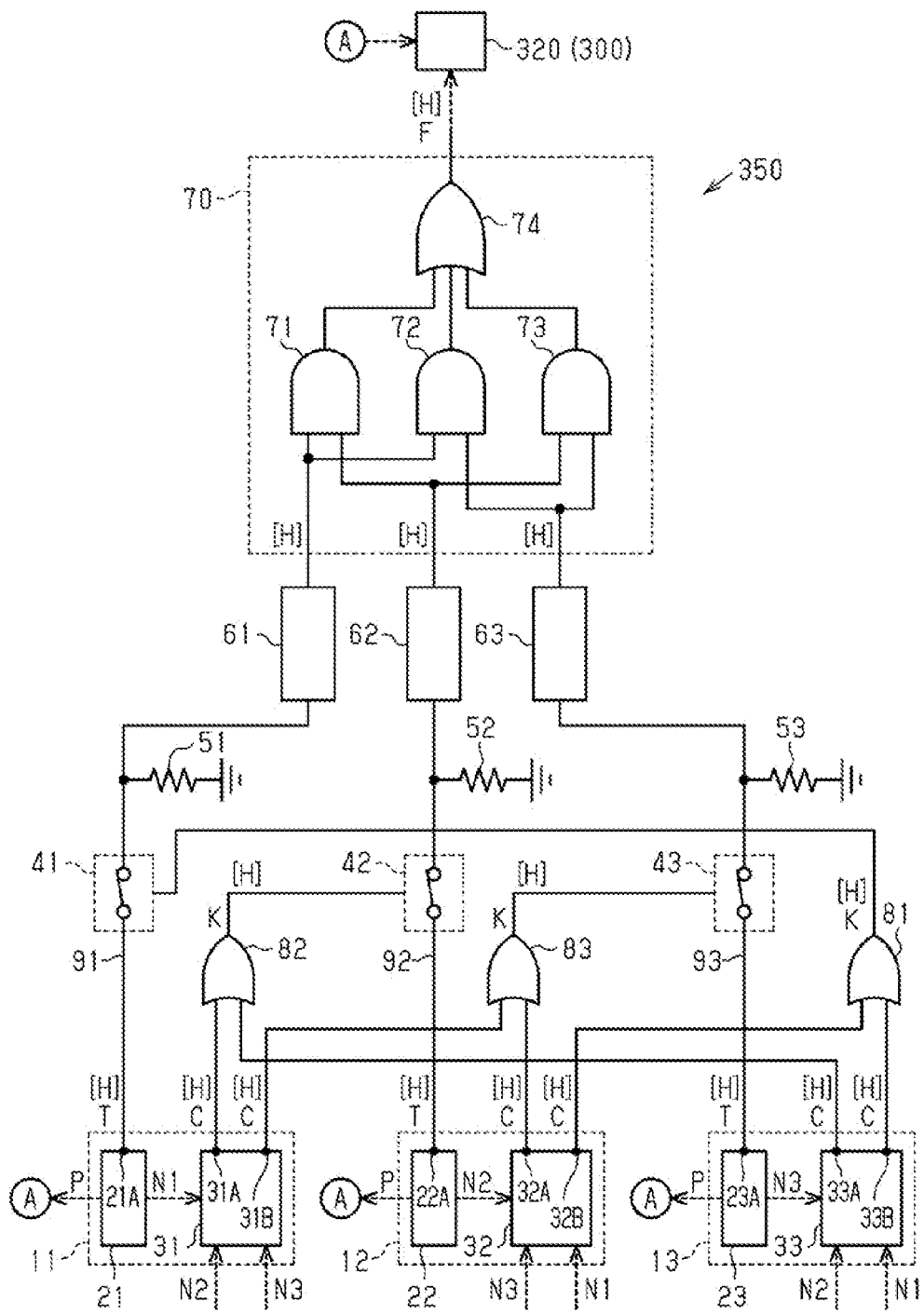
FIG. 2 schematically illustrates a first redundancy control device where three controllers normally operate.

As shown in FIG. 2, the first redundancy control device 350 includes three controllers 11, 12, and 13 that have an identical configuration. The three controllers 11, 12, and 13 each have a control circuit that performs a comprehensive control and a comparison circuit that exchanges information with the control circuit. When describing about the controller, which could be any one of the three controllers 11, 12, and 13, given reference numeral will not be herein used to describe the controller. Likewise, when describing components such as the control circuit and the comparison circuit in the controller, which could be any one of the three controllers 11, 12, and 13, given reference numeral will not be herein used to describe the component.

A first control circuit 21 of the first controller 11 generates and outputs a control signal P for the first hydraulic circuit 320 based on the command signal S from the upper-level device 700. A second control circuit 22 of the second controller 12 and a third control circuit 23 of the third controller 13 also perform identical functions as the first control circuit 21. One of the three controllers 11, 12, and 13 is selected as a main system, and the control signal P of the controller selected as the main system is supplied to the first hydraulic circuit 320.

The first control circuit 21 performs a count-up process in which counting up is carried out over a predetermined fixed period, and outputs that operational result to the first comparison circuit 31 of the first controller 11 as a first status signal N1 of the first controller 11. The first control circuit 21 repeats such a process at a predetermined cycle. Once the first status signal N1 is supplied to the first comparison circuit 31, the first comparison circuit 31 outputs the first status signal to a second comparison circuit 32 of the second controller 12 and a third comparison circuit 33 of the third controller 13 via a communication line (not shown). The second control circuit 22 and the second comparison circuit 32 also perform the same processes to output a second status signal N2 of the second controller 12 to the first comparison circuit 31 and the third comparison circuit 33. The third control circuit 23 and the third comparison circuit 33 also perform the same processes to output a third status signal N3 of the third controller 13 to the first comparison circuit 31 and the second comparison circuit 32. Thus, the three comparison circuits 31, 32, and 33 exchange their status signals with each other. The three comparison circuits 31, 32, and 33 send and receive status signals in synchronization with each other.

The first comparison circuit 31 has two output terminals that output comparison signals C based on a comparison between the first status signal N1 and the status signals of the other controllers. A first comparison output terminal 31A, which is one of the two output terminals, outputs the comparison signal C based on a comparison between the first status signal N1 and the second status signal N2. The first comparison output terminal 31A outputs a high voltage H as the comparison signal C when the first status signal N1 and the second status signal N2 match each other, and outputs a low voltage L, which is a voltage lower than the voltage H, when the first status signal N1 and the second status signal N2 do not match each other. A second comparison output terminal 31B, which is the other of the two output terminals, outputs the comparison signal C based on a comparison between the first status signal N1 and the third status signal N3. The second comparison output terminal 31B outputs the high voltage H as the comparison signal C when the first status signal N1 and the third status signal N3 match each other, and outputs the low voltage L when the first status signal N1 and the third status signal N3 do not match each other.

Similar to the first comparison circuit 31, the second comparison circuit 32 has a first comparison output terminal 32A and a second comparison output terminal 32B. The first comparison output terminal 32A outputs the comparison signal C based on a comparison between the second status signal N2 and the third status signal N3, and the second comparison output terminal 32B outputs the comparison signal C based on a comparison between the second status signal N2 and the first status signal N1. The third comparison circuit 33 also has a first comparison output terminal 33A and a second comparison output terminal 33B. The first comparison output terminal 33A outputs the comparison signal C based on a comparison between the third status signal N3 and the second status signal N2, and the second comparison output terminal 33B outputs the comparison signal C based on a comparison between the third status signal N3 and the first status signal N1. Similar to the first comparison circuit 31, each comparison output terminal outputs the high voltage H as the comparison signal C when the two status signals inputted thereto match each other, and outputs the low voltage L as the comparison signal C when the two status signals inputted thereto do not match each other.

The first control circuit 21 has an abnormality output terminal 21A that outputs an output signal T indicating the presence or absence of an abnormality in the first redundancy control device 350. The abnormality output terminal 21A outputs the output signal T based on the comparison signals C output from the two comparison output terminals 31A and 31B of the first comparison circuit 31. Specifically, the abnormality output terminal 21A outputs the high voltage H as the output signal T when at least one of the comparison signals C output from the two comparison output terminals 31A and 31B of the first comparison circuit 31 has a high voltage H. Whereas when both the comparison signals C output from the two comparison output terminals 31A and 31B have the low voltage L, the abnormality output terminal 21A outputs the low voltage L as the output signal T. The second control circuit 22 also has an identical abnormality output terminal 22A, and the third control circuit 23 also has an identical abnormality output terminal 23A. That is, these abnormality output terminals also output the high voltage H as the output signal T when at least one of the comparison signals C output from the two output terminals of their comparison circuits of their own controllers has the high voltage H. Whereas the output terminals output the low voltage L when both the comparison signals C have the low voltage L.

When an abnormality occurs in the flight control system for operating various moving surfaces of the aircraft, for example, a signal indicating the abnormality of the flight control system is transmitted to the three control circuits 21, 22, 23 as the command signal S from the upper-level device 700. In this case, the three control circuits 21, 22, 23 forcibly output the output signal T of the low voltage L from the abnormality output terminals 21A, 22A, and 23A, respectively. Further, when a signal instructing shutdown of the first redundancy control device 350 is supplied to the three control circuits 21, 22, 23 via the upper-level device 700 or any other circuit, the three control circuits 21, 22, 23 forcibly output the output signal T of the low voltage L from the abnormality output terminals 21A, 22A, 23A respectively. When a signal instructing activation of the first redundancy control device 350 is supplied to the three control circuits 21, 22, 23 via the upper-level device 700 or any other circuit, the three control circuits 21, 22, 23 forcibly output the output signal T of the high voltage H from the abnormality output terminals 21A, 22A, 23A, respectively when initializing process of the respective control circuit is completed.

Output lines are connected to the abnormality output terminals 21A, 22A, and 23A, respectively. That is, a first output line 91 is connected to the abnormality output terminal 21A of the first control circuit 21. A second output line 92 is connected to the abnormality output terminal 22A of the second control circuit 22. A third output line 93 is connected to the abnormality output terminal 23A of the second control circuit 23.

These three output lines 91, 92, 93 are connected to a majority voting circuit 70. The majority voting circuit 70 establishes a majority vote of the output signals T inputted from these three output lines 91, 92, 93 and outputs the low voltage L or the high voltage H as a final output signal F. Specifically, the majority voting circuit 70 includes three AND circuits, that is, a first AND circuit 71, a second AND circuit 72, and a third AND circuit 73. The first output line 91 and the second output line 92 are connected to input terminals of the first AND circuit 71. The first output line 91 and the third output line 93 are connected to input terminals of the second AND circuit 72. The second output line 92 and the third output line 93 are connected to input terminals of the third AND circuit 73. Each of the three AND circuits 71, 72, 73 outputs the low voltage L when at least one of the output signals T from the two output lines has the low voltage L, and outputs the high voltage H when both the output signals T from the two output lines have the high voltage H.

The output terminals of the three AND circuits 71, 72, 73 are connected to input terminals of an OR circuit 74 in the majority voting circuit 70. The OR circuit 74 outputs the low voltage L from its output terminal when all the signals inputted thereto from the three AND circuits 71, 72, 73 have the low voltage L. Whereas when at least one of the signals from the three AND circuits 71, 72, 73 has the high voltage H, the OR circuit 74 outputs the high voltage H from its output terminal. The output from the OR circuit 74 is outputted to the first hydraulic circuit 320 as a final output signal F from the first redundancy control device 350. The final output signal F is a signal for switching between enable and disable of the control signal P outputted by the control circuit. When the final output signal F has the high voltage H, the control signal P is enabled and the first hydraulic circuit 320 is controlled based on the control signal P. Whereas when the final output signal F has the low voltage L, the control signal P is disabled. At the same time, in the first hydraulic circuit 320, the mode switching valve 550 shown in FIG. 1 is switched to the bypass mode.

As shown in FIG. 2, a first switch 41 that switching between connection and disconnection of the first output line 91 is provided in the first output line 91. The first switch 41 is a so-called normally open switch, and is configured to be connected when the high voltage H is supplied thereto, and disconnected when the low voltage L is supplied thereto.

In the first output line 91, a first pull-down resistor 51 is provided on the downstream side of the first switch 41 with respect to the flowing direction of the signal in the first output line 91, that is, on the side of the first switch 41 closer to the majority voting circuit 70. The first pull-down resistor 51 serves as a voltage supply unit. Here, when the first switch 41 is switched to the disconnected state, the output signal T from the first controller 11 is lost in the first output line 91. At this time, the low voltage L is applied to the first output line 91 by the first pull-down resistor 51. That is, the first pull-down resistor 51 supplies the low voltage L to the first output line 91 when the output signal T from the first controller 11 is lost as the first switch 41 switches to the disconnected state.

In the first output line 91, a first latch circuit 61 is provided on the downstream side of the first pull-down resistor 51 with respect to the flowing direction of the signal in the first output line 91, that is, on the side of the first pull-down resistor 51 closer to the majority voting circuit 70. Once the low voltage L is supplied to the first latch circuit 61, the first latch circuit 61 latches the low voltage L and keeps outputting the low voltage L. Although not shown, the first latch circuit 61 is connected to reset lines extending from the three controllers 11, 12, 13. The first latch circuit 61 returns to an initial state when latch clear signals are supplied thereto from all the three controllers 11, 12, 13 through the reset lines.

Similarly to the first output line 91, a second switch 42, a second pull-down resistor 52, and a second latch circuit 62 are connected in the second output line 92. Further, a third switch 43, a third pull-down resistor 53, and a third latch circuit 63 are also connected in the third output line 93.

A first switch control unit 81 is connected to the first switch 41. The first switch control unit 81 is formed of an OR circuit. The first switch control unit 81 receives the comparison signals C from the second comparison circuit 32 and the third comparison circuit 33, and outputs a switch signal K to the first switch 41 based on the comparison signals C. Specifically, the second comparison output terminal 32B of the second comparison circuit 32 is connected to one input terminal of the first switch control unit 81. As described above, the second comparison output terminal 32B outputs the comparison signal C based on the comparison between the second status signal N2 and the first status signal N1. Further, the second comparison output terminal 33B of the third comparison circuit 33 is connected to the other input terminal of the first switch control unit 81. As described above, the second comparison output terminal 33B outputs the comparison signal C based on the comparison between the third status signal N3 and the first status signal N1.

The first switch control unit 81 outputs the high voltage H as the switch signal K when the high voltage H indicating a match between the second status signal N2 and the first status signal N1 is inputted to the first switch control unit 81 from the second comparison output terminal 32B of the second comparison circuit 32, or when the high voltage H indicating a match between the third status signal N3 and the first status signal N1 is inputted to the first switch control unit 81 from the second comparison output terminal 33B of the third comparison circuit 33. The first switch control unit 81 outputs the low voltage L as the switch signal K when the low voltage L indicating a mismatch between the second status signal N2 and the first status signal N1 is inputted to the first switch control unit 81 from the second comparison output terminal 32B of the second comparison circuit 32 and the low voltage L indicating a mismatch between the third status signal N3 and the first status signal N1 is inputted to the first switch control unit 81 from the second comparison output terminal 33B of the third comparison circuit 33. As described above, the high voltage H is the switching signal K that switches the first switch 41 to the connected state, and the low voltage L is the switching signal K that switches the first switch 41 to the disconnected state.

A second switch control unit 82 identical to the first switch control unit 81 is connected to the second switch 42. One input terminal of the second switch control unit 82 is connected to the first comparison output terminal 31A of the first comparison circuit 31 that outputs a result of comparison between the first status signal N1 and the second status signal N2. The other input terminal of the second switch control unit 82 is connected to the first comparison output terminal 33A of the third comparison circuit 33 that outputs a result of comparison between the third status signal N3 and the second status signal N2. The second switch control unit 82 outputs the high voltage H as the switch signal K when the high voltage H indicating a match between the first status signal N1 and the second status signal N2 is inputted to the second switch control unit 82 from the first comparison output terminal 31A of the first comparison circuit 31, or when the high voltage H indicating a match between the third status signal N3 and the second status signal N2 is inputted to the second switch control unit 82 from the first comparison output terminal 33A of the third comparison circuit 33. The second switch control unit 82 outputs the low voltage L as the switch signal K when the low voltage L indicating a mismatch between the first status signal N1 and the second status signal N2 is inputted to the second switch control unit 82 from the first comparison output terminal 31A of the first comparison circuit 31 and the low voltage L indicating a mismatch between the third status signal N3 and the second status signal N2 is inputted to the second switch control unit 82 from the first comparison output terminal 33A of the third comparison circuit 33.

A third switch control unit 83 identical to the first switch control unit 81 and the second switch control unit 82 is connected to the third switch 43. One input terminal of the third switch control unit 83 is connected to the second comparison output terminal 31B of the first comparison circuit 31 that outputs a result of comparison between the first status signal N1 and the third status signal N3. The other input terminal of the third switch control unit 83 is connected to the first comparison output terminal 32A of the second comparison circuit 32 that outputs a result of comparison between the second status signal N2 and the third status signal N3. The third switch control unit 83 outputs the high voltage H as the switch signal K when the high voltage H indicating a match between the first status signal N1 and the third status signal N3 is inputted to the third switch control unit 83 from the second comparison output terminal 31B of the first comparison circuit 31, or when the high voltage H indicating a match between the second status signal N2 and the third status signal N3 is inputted to the third switch control unit 83 from the first comparison output terminal 32A of the second comparison circuit 32. The third switch control unit 83 outputs the low voltage L as the switch signal K when the low voltage L indicating a mismatch between the first status signal N1 and the third status signal N3 is inputted to the third switch control unit 83 from the second comparison output terminal 31B of the first comparison circuit 31 and the low voltage L indicating a mismatch between the second status signal N2 and the third status signal N3 is inputted to the third switch control unit 83 from the first comparison output terminal 32A of the second comparison circuit 32.

The following describes operations in the present embodiment.

(A) Circuit Operation when the Three Controllers 11, 12, 13 Operate Normally It is assumed that all three controllers 11, 12, and 13 operate normally. In this case, the first status signal N1, the second status signal N2, and the third status signal N3 match with each other. Thus, to the first switch control unit 81, the high voltage H indicating the match between the second status signal N2 and the first status signal N1 is inputted from the second comparison output terminal 32B of the second comparison circuit 32, and the high voltage H indicating the match between the third status signal N3 and the first status signal N1 is inputted from the second comparison output terminal 33B of the third comparison circuit 33. Since both of the two comparison signals C inputted to the first switch control unit 81 have the high voltage H, the switch signal K output from the first switch control unit 81 has the high voltage H. As a result, the first switch 41 is controlled to the connected state. Here, the first comparison output terminal 31A of the first comparison circuit 31 outputs the high voltage H indicating the match between the first status signal N1 and the second status signal N2, the second comparison output terminal 31B outputs the high voltage H indicating the match between the first status signal N1 and the third status signal N3, so that the high voltage H is output to the first output line 91 from the abnormality output terminal 21A of the first control circuit 21. Since the first switch 41 is connected, this high voltage H is supplied to the majority voting circuit 70 through the first output line 91.

Since the first status signal N1, the second status signal N2, and the third status signal N3 match with each other, like the first switch control unit 81, the high voltage H indicating the match between the status signals are inputted to the second switch control unit 82 from both the first comparison output terminal 31A of the first comparison circuit 31 and the first comparison output terminal 33A of the third comparison circuit 33. Thus, the high voltage H is outputted from the second switch control unit 82 as the switch signal K. As a result, the second switch 42 is controlled to the connected state. Then, like the first comparison circuit 31, the high voltage H indicating the match between the status signals is outputted from both the two comparison output terminals 32A and 32B of the second comparison circuit 32, so that the high voltage H is outputted from the abnormality output terminal 22A of the second control circuit 22 to the second output line 92. Since the second switch 42 is connected, this high voltage H is supplied to the majority voting circuit 70 through the second output line 92.

Like the first switch control unit 81 and the second switch control unit 82, the high voltage H indicating the match between the status signals are inputted to the third switch control unit 83 from both the second comparison output terminal 31B of the first comparison circuit 31 and the first comparison output terminal 32A of the second comparison circuit 32. Thus, the high voltage H is outputted from the third switch control unit 83 as the switch signal K. As a result, the third switch 43 is controlled to the connected state. The high voltage H indicating the match between the status signals is outputted from both the two comparison output terminals 33A and 33B of the third comparison circuit 33, so that the high voltage H is outputted from the abnormality output terminal 23A of the third control circuit 23 to the third output line 93. Since the third switch 43 is connected, this high voltage H is supplied to the majority voting circuit 70 through the third output line 93.

As described above, since the three output lines 91, 92, 93, supply the high voltage H to the majority voting circuit 70, the majority voting circuit 70 outputs the high voltage H as the final output signal F. Consequently, the control signal P outputted by the control circuit is enabled, and the first hydraulic circuit 320 is controlled based on the control signal P. That is, the first actuator 300 is in the active mode.

(B) Circuit Operation when the First Controller 11 Fails

Figure 3:
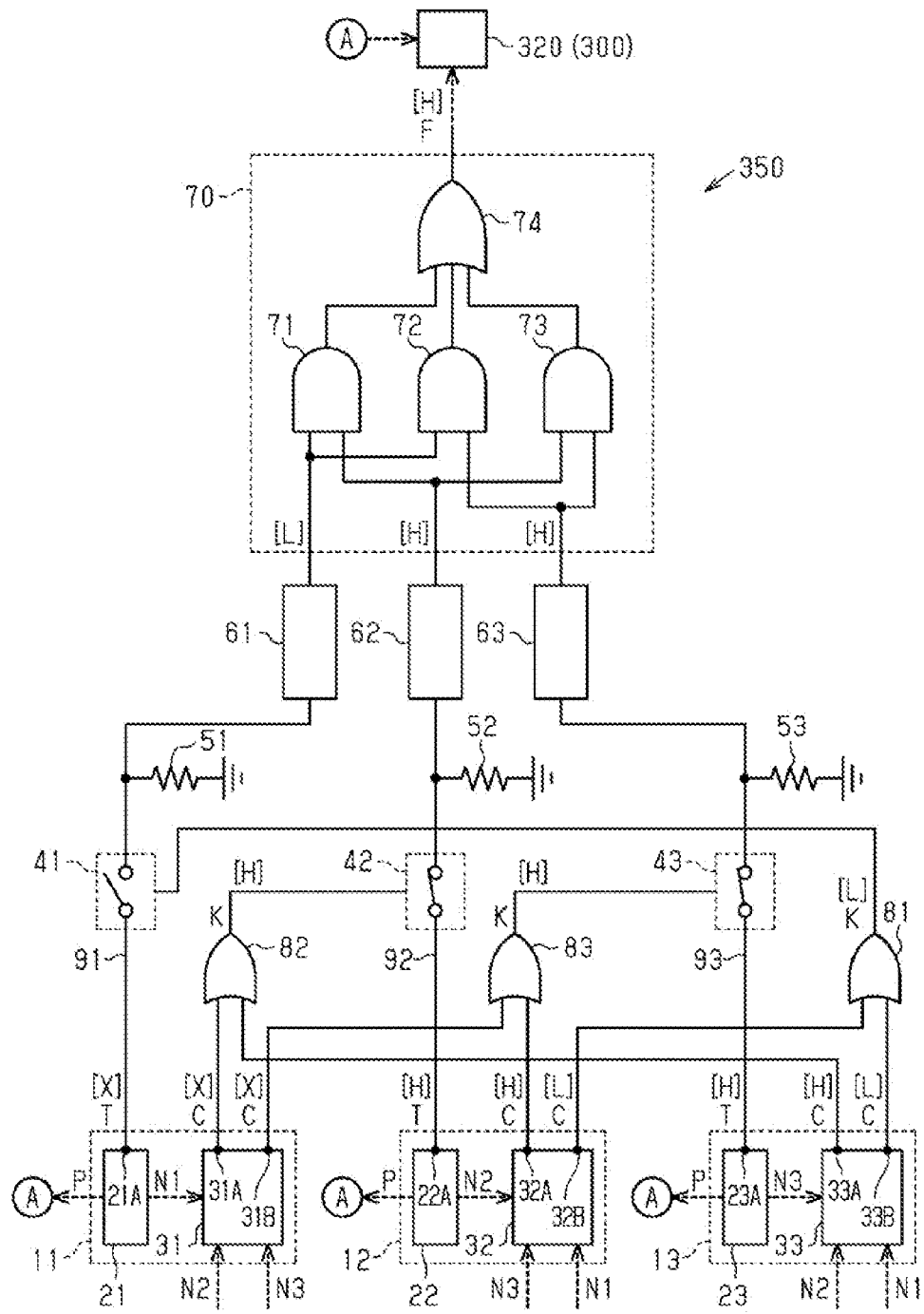
FIG. 3 schematically illustrates the first redundancy control device where the first controller fails.

It is assumed that the first controller 11 fails from the state where the three controllers 11, 12, and 13 operate normally. In this case, since the first controller 11 is out of order, the output signal T outputted from the abnormality output terminal 21A of the first control circuit 21 cannot be defined, and the output signal T may have the low voltage L or high voltage H as shown in FIG. 3. In FIG. 3, the state where the signal is indefinite is indicated by "X". Since the first controller 11 is out of order, the comparison signal C outputted from the two comparison output terminals 31A and 31B of the first comparison circuit 31 are also indefinite.

Since the first controller 11 is out of order, the second status signal N2 and the third status signal N3 match with each other while the first status signal N1 does not match them. Thus, to the first switch control unit 81, the low voltage L indicating mismatch between the second status signal N2 and the first status signal N1 is inputted from the second comparison output terminal 32B of the second comparison circuit 32, and the low voltage L indicating mismatch between the third status signal N3 and the first status signal N1 is inputted from the second comparison output terminal 33B of the third comparison circuit 33. Since both of the two comparison signals C inputted to the first switch control unit 81 have the low voltage L, the switch signal K output from the first switch control unit 81 has the low voltage L. Therefore, the first switch 41 is controlled to the disconnected state. In this case, the low voltage L is supplied to the first output line 91 from the first pull-down resistor 51. Then, the first latch circuit 61 latches the low voltage L and continues to output the low voltage L. Consequently, the low voltage L is inputted to the majority voting circuit 70 from the first output line 91.

To the second switch control unit 82, the low voltage L or the high voltage H is inputted from the first comparison output terminal 31A of the failed first comparison circuit 31, and the high voltage H indicating the match between the third status signal N3 and the second status signal N2 is inputted from the first comparison output terminal 33A of the third comparison circuit 33. Since the high voltage H is inputted to the second switch control unit 82 at least from the first comparison output terminal 33A of the third comparison circuit 33, the switch signal K outputted from the second switch control unit 82 has the high voltage H. As a result, the second switch 42 is controlled to the connected state. Here, the high voltage H indicating the match between the second status signal N2 and the third status signal N3 is outputted from the first comparison output terminal 32A of the second comparison circuit 32, and the low voltage L indicating the mismatch between the second status signal N2 and the first status signal N1 is outputted from the second comparison output terminal 32B. Accordingly at least one of the comparison output terminals of the second comparison circuit 32 outputs the high voltage H, so that the high voltage H is outputted to the second output line 92 from the abnormality output terminal 22A of the second control circuit 22. Since the second switch 42 is connected at this time, this high voltage H is supplied to the majority voting circuit 70 through the second output line 92.

To the third switch control unit 83, the low voltage L or the high voltage H is inputted from the second comparison output terminal 31B of the failed first comparison circuit 31, and the high voltage H indicating the match between the second status signal N2 and the third status signal N3 is inputted from the first comparison output terminal 32A of the second comparison circuit 32. Since the high voltage H is inputted to the third switch control unit 83 at least from the first comparison output terminal 32A of the second comparison circuit 32, the switch signal K outputted from the third switch control unit 83 has the high voltage H. As a result, the third switch 43 is controlled to the connected state. Here, the high voltage H indicating the match between the third status signal N3 and the second status signal N2 is outputted from the first comparison output terminal 33A of the third comparison circuit 33, and the low voltage L indicating the mismatch between the third status signal N3 and the first status signal N1 is outputted from the second comparison output terminal 33B. Accordingly, similar to the abnormality output terminal 22A of the second control circuit 22, the high voltage H is outputted to the third output line 93 from the abnormality output terminal 23A of the third control circuit 23. Since the third switch 43 is connected at this time, this high voltage H is supplied to the majority voting circuit 70 through the third output line 93.

As described above, the low voltage L is inputted to the majority voting circuit 70 from the first output line 91 while the second output line 92 and the third output line 93 input the high voltage H to the majority voting circuit 70. Thus, the majority voting circuit 70 outputs the high voltage H as the final output signal F. Consequently, the control signal P outputted by the normal second control circuit 22 and the normal third control circuit 23 are enabled, and the first hydraulic circuit 320 is controlled based on the control signal P.

Figure 4:
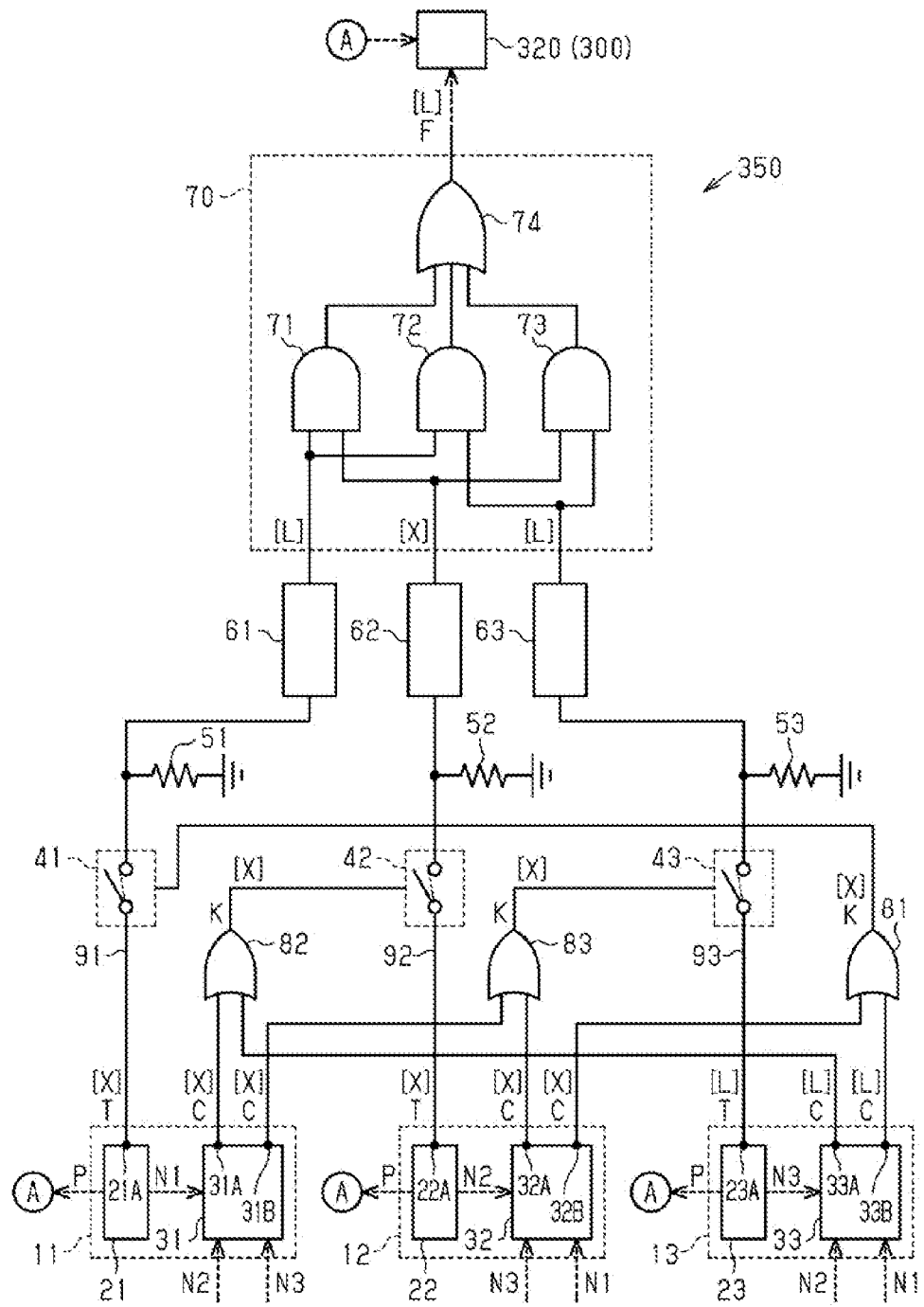
FIG. 4 schematically illustrates the first redundancy control device where the first controller and the second controller fail.

(C) Circuit Operation when the First Controller 11 and the Second Controller 12 Fail It is assumed that the second controller 12 further fails from the state where the first controller 11 has failed. In this case, not only in the first controller 11 but also in the second controller 12, the output signal T outputted from the abnormality output terminal 22A of the second control circuit 22 is indefinite as shown in FIG. 4. Further, the comparison signals C outputted from both of the two comparison output terminals 32A and 32B of the second comparison circuit 32 are also indefinite.

Since both the first controller 11 and the second controller 12 are out of order, the third status signal N3 does not match with the first status signal N1 and the second status signal N2. Thus, to the first switch control unit 81, the low voltage L or the high voltage H is inputted from the second comparison output terminal 32B of the failed second comparison circuit 32, and the low voltage L indicating the mismatch between the third status signal N3 and the first status signal N1 is inputted from the second comparison output terminal 33B of the third comparison circuit 33. The switch signal K from the first switch control unit 81 can have either the low voltage L or the high voltage H depending on the output from the second comparison output terminal 32B of the second comparison circuit 32, so that the first switch 41 can be in the connected state or the disconnected state. However, in either case, since the low voltage L is latched by the first latch circuit 61 at the time of failure of the first controller 11 described in the above (B), the low voltage L is supplied to the majority decision circuit 70 from the first output line 91.

To the second switch control unit 82, the low voltage L or the high voltage H is inputted from the first comparison output terminal 31A of the failed first comparison circuit 31, and the low voltage L indicating the mismatch between the third status signal N3 and the second status signal N2 is inputted from the first comparison output terminal 33A of the third comparison circuit 33. In this case, the switch signal K from the second switch control unit 82 can have either the low voltage L or the high voltage H depending on the output from the first comparison output terminal 31A of the first comparison circuit 31. Thus, the second switch 41 can be in the connected state or the disconnected state. When the second switch 42 is controlled to the disconnected state, the low voltage L is supplied to the second output line 92 from the second pull-down resistor 52, and the second latch circuit 62 latches the low voltage L. Consequently, the low voltage L is inputted to the majority voting circuit 70 from the second output line 92. When the second switch 42 is controlled to the connected state, the low voltage L or the high voltage H is outputted from the abnormality output terminal 22A of the failed second control circuit 22, so that the low voltage L or the high voltage H is inputted to the majority voting circuit 70 from the second output line 92. As discussed above, the signal inputted from the second output line 92 to the majority voting circuit 70 is indefinite.

To the third switch control unit 83, the low voltage L or the high voltage H is inputted from the second comparison output terminal 31B of the failed first comparison circuit 31, and the low voltage L or the high voltage H is inputted from the first comparison output terminal 32A of the failed second comparison circuit 32. In this case, the switch signal K from the third switch control unit 83 can have either the low voltage L or the high voltage H. Thus, the third switch 43 can be in the connected state or the disconnected state. Here, the case where the third switch 43 is controlled to the connected state is considered. The first comparison output terminal 33A of the third comparison circuit 33 outputs the low voltage L indicating the mismatch between the third status signal N3 and the second status signal N2, the second comparison output terminal 33B also outputs the low voltage L indicating the mismatch between the first status signal N1 and the third status signal N3, so that the low voltage L is outputted to the third output line 93 from the abnormality output terminal 23A of the third control circuit 23. Since the third switch 43 is connected, this low voltage L is supplied to the majority voting circuit 70 through the third output line 93. Next, the case where the third switch 43 is controlled to the disconnected state is considered. In this case, the low voltage L is supplied to the third output line 93 from the third pull-down resistor 53, and the third latch circuit 63 latches the low voltage L. Consequently, the low voltage L is inputted to the majority voting circuit 70 from the third output line 93. As described above, the low voltage L is inputted to the majority voting circuit 70 from the third output line 93 regardless of whether the third switch 43 is in the connected state or in the disconnected state.

As described above, the low voltage L is inputted to the majority voting circuit 70 from the first output line 91 and the third output line 93 while the second output line 92 inputs the low voltage L or the high voltage H to the majority voting circuit 70. Thus, the majority voting circuit 70 outputs the low voltage L as the final output signal F. Consequently, the control signal P outputted by the normal third control circuit 23 is disabled. Accordingly, in the first hydraulic circuit 320, the mode switching valve 550 is switched to the bypass mode. That is, the first actuator 300 enters the standby mode.

Advantageous effects of the embodiment will be now described.

(1) The status signal of the failed controller does not match the status signal of the normal controller. Utilizing this characteristic, the switch control unit determines that the own controller, which is the controller for the output line provided with the switch that the switch control unit controls, is out of order and disconnects the switch when both the two comparison signals C inputted from the comparison circuits other than the own controller show the mismatch. Then, the control unit supplies the low voltage L to the disconnected output line via the pull-down resistor and the latch circuit. By disconnecting the output line of the failed controller and forcibly supplying the low voltage L thereto, if two controllers fail, the low voltage is transmitted to the majority voting circuit from the corresponding two output lines and the final output signal F assuredly becomes the low voltage L. Thereby, the first actuator 300 can be reliably switched to the standby mode when the two controllers fail. In this way, when two controllers fail, a reliable output can be obtained as the final output signal.

Moreover, the first redundancy control device 350 is formed by combinations of simple analog circuits such as the switch control units which are the OR circuits, the pull-down resistors, and the latch circuits. Since such analog circuits are less likely to fail, the failure rate of the first redundancy control device 350 can be reduced.

(2) Only the first actuator 300 is controlled to operate in the active mode during normal operation. Thus, if the two controllers in the first redundancy control device 350 fail, the first actuator 300 is switched to the standby mode, and the second actuator 400 is switched to the active mode, the number of actuators that drive the flap 600 remains the same before and after the switching so that the driving force for driving the flap 600 does not change. With such a configuration, it is not necessary to control the driving force for the other flaps and moving surfaces in accordance with the switching of the first actuator 300 to the standby mode.

The above embodiment can be modified as described below. The above embodiment and the following modifications can be implemented in combination to the extent where they are technically consistent with each other.

Figure 5:
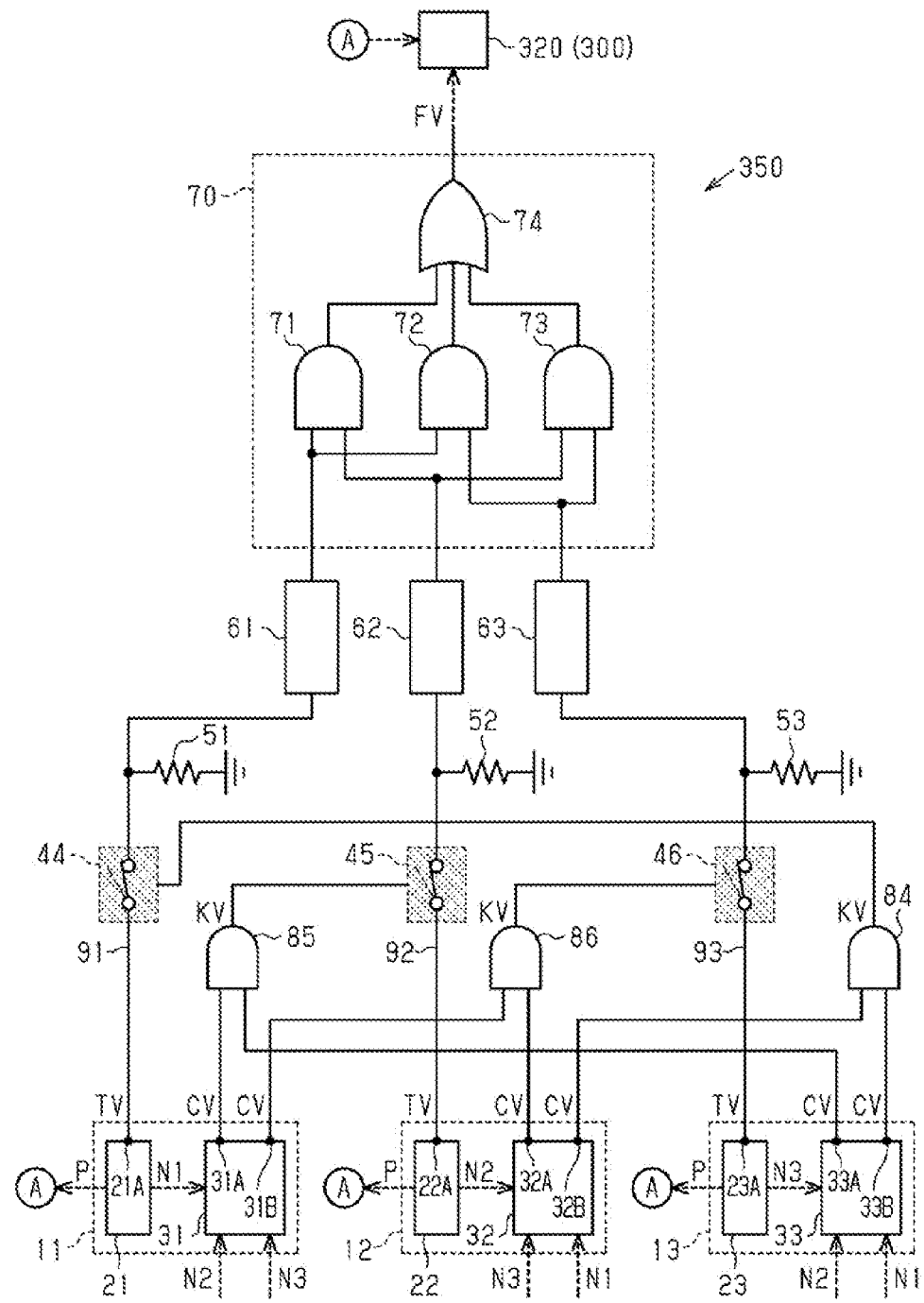
FIG. 5 schematically illustrates a modification example of the first redundancy control device.

The number of the comparison signals is not limited to the example in the above embodiment. That is, as the comparison signal CV output from each of the comparison circuits 31, 32, 33, the low voltage L may be outputted when the two status signals match each other, whereas the high voltage H is outputted when the two status signals do not match each other as shown in FIG. 5. In this case, the first switch control unit 84, the second switch control unit 85, and the third switch control unit 86 are each composed of an AND circuit. That is, when at least one of the two comparison signals CV inputted to the switch control unit has the low voltage L indicating that the status signals match each other, the switch control unit outputs the low voltage L. Whereas when both of the two comparison signals C have the high voltage H indicating the mismatch between the status signals, the switch control unit outputs the high voltage H. In this case, the first switch 44, the second switch 45, and the third switch 46 are each formed as a normally closed switch, and the switching thereof by the switch signal is inverted from the example of the above embodiment. That is, when a switch signal KV output by each switch control unit 84, 85, 86 has the low voltage L, the switches 44, 45, 46 are controlled to be the connected state, whereas when the switch signal KV has the high voltage H, the switch 44, 45, 46 are controlled to be the disconnected state. With this configuration, when at least one of the two comparison signals CV inputted to the switch control unit is the low voltage L indicating the match between the status signals, the switch is controlled to be the connected state. Whereas when both of the two comparison signals CV inputted to the switch control unit are the high voltage H indicating the mismatch between the status signals, the switch is controlled to be the disconnected state. In this way, as in the above embodiment, the output line of the controller can be disconnected when the controller fails.

Further, when the comparison signals CV as described above are adopted, output signals TV outputted from the control circuit 21, 22, 23 may be changed as follows. When at least one of the comparison signals CV outputted from the two comparison output terminals of the comparison circuit has the low voltage L indicating the match between the status signals, the high voltage H is outputted as the output signal TV. Further, when both of the comparison signals CV outputted from the two comparison output terminals of the comparison circuit have the high voltage H indicating the mismatch between the status signals, the low voltage L is outputted as the output signal TV. With this configuration, the low voltage L or high voltage H is outputted as the output signal TV under the same conditions as in the above embodiment in terms of the match or mismatch between the status signals. Therefore, the handling of the final output signal FV will be the same as in the above embodiment. That is, the control signal P may be enabled when the final output signal FV has the high voltage H, and the control signal P may be disabled when the final output signal FV has the low voltage L.

Figure 6:
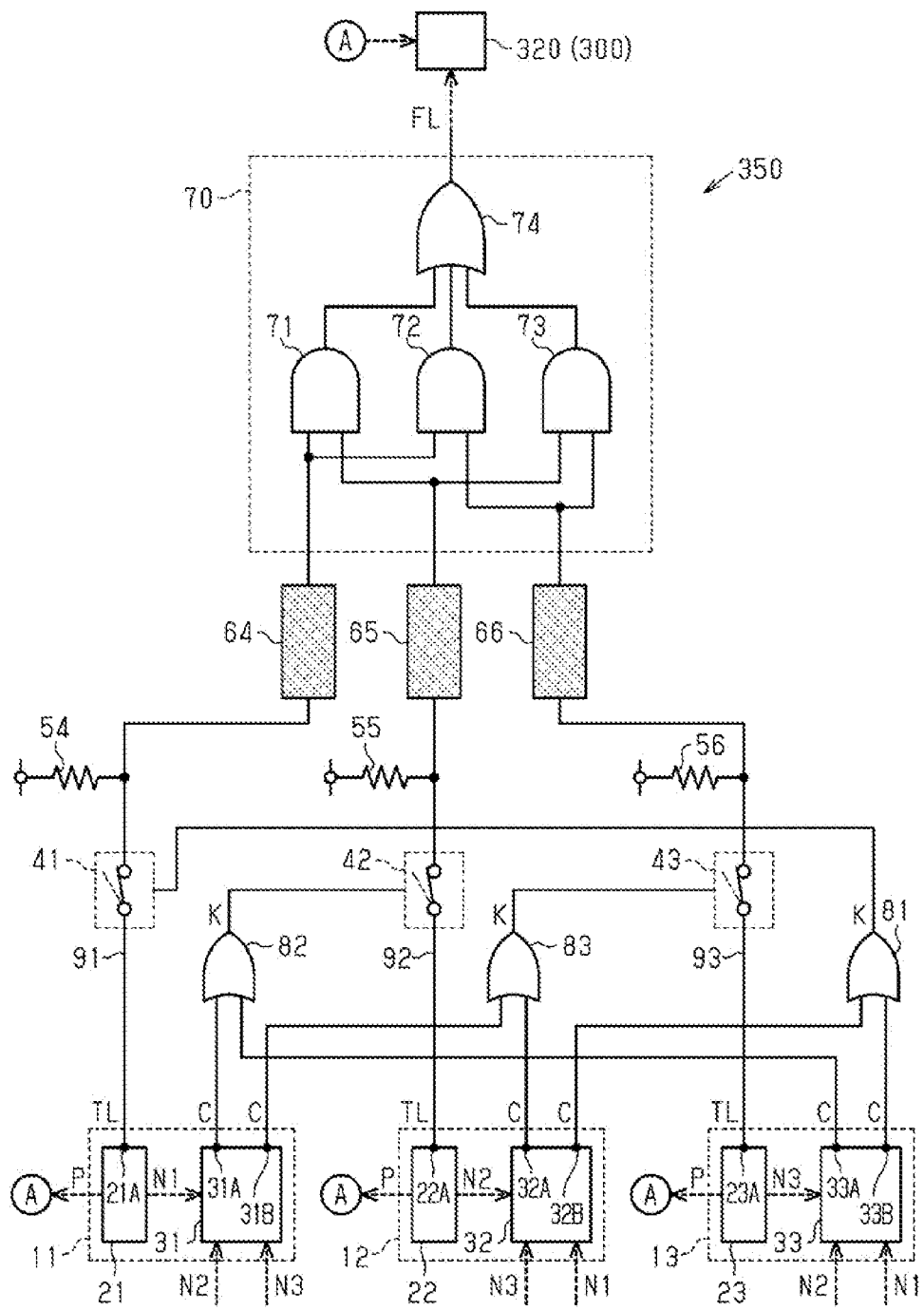
FIG. 6 schematically illustrates a modification example of the first redundancy control device.

The output signal setting may be changed from that of the above embodiment while keeping the setting of the comparison signals C the same as that of the above embodiment. Specifically, as shown in FIG. 6, when at least one of the comparison signals C outputted from the two comparison output terminals of the comparison circuit has the high voltage H indicating the match between the status signals, the low voltage L is output as the output signal TL outputted from each control circuit 21, 22, 23, Whereas when both the comparison signals C outputted from the two comparison output terminals are the low voltage L indicating the mismatch between the status signals, the high voltage H is outputted as the output signal TL. In this case, the handling of the final output signal FL is also changed. That is, when the final output signal FL has the low voltage L, the control signal P is enabled and the first hydraulic circuit 320 is controlled based on the control signal P. Whereas when the final output signal FL has the high voltage H, the control signal P is disabled and the mode switching valve 550 is switched to operate in the bypass mode. When the output signal TL is configured as described above, the three pull-down resistors of the above-described embodiment are replaced by a first pull-up resistor 54, a second pull-up resistor 55, and a third pull-up resistor 56 respectively that are connected to the respective output lines 91, 92, 93. These pull-up resistors 54, 55, 56 each supply the high voltage H to the corresponding output line when the output line is disconnected. In addition, the first latch circuit 64, the second latch circuit 65, and the third latch circuit 66 are configured to latch the high voltage H and continue to output the high voltage H when the high voltage H is inputted to thereto. In this configuration, the high voltage H is supplied to the output line by the pull-up resistor when the respective output lines 91, 92, 93 are disconnected, and the latch circuit latches the high voltage H to keep outputting the high voltage H. Therefore, when the two output lines are disconnected in response to the failure of the two corresponding controllers, the high voltage H is supplied to the majority voting circuit 70 from at least these two output lines. Then, the high voltage H is outputted from the majority voting circuit 70 as the final output signal FL. In this way, as in the above embodiment, the mode switching valve 550 can be switched to the bypass mode when the two controllers fail.

In the case where the setting of the output signal TL is modified as described above, when a signal indicating an abnormality related to the aircraft's flight is supplied to each control circuit 21, 22, 23 as the command signal S from the upper-level device 700, the high voltage H may be forcibly outputted from the respective abnormality output terminals. Further, when a signal instructing the shutdown of the first redundancy control device 350 is inputted to each of the control circuits 21, 22, 23, the high voltage H may be forcibly outputted from the respective abnormality output terminals. Further, when a signal instructing the activation of the first redundancy control device 350 is inputted to each of the control circuits 21, 22, 23, the low voltage L may be forcibly outputted as the output signal T from the respective abnormality output terminals.

As in the first modification example, as the comparison signal CV outputted from each of the comparison circuits 31, 32, 33, the low voltage L is outputted when the status signals match each other, and the high voltage H is outputted when the status signals do not match each other. Then, as the output signal TY outputted from each control circuit 21, 22, 23, the low voltage may be outputted when at least one of the comparison signals CV outputted from the two comparison output terminals of the comparison circuit has the low voltage L indicating the match between the status signals, and the high voltage H is outputted when both of the comparison signals CV outputted from the two comparison output terminals have the high voltage H indicating the mismatch between the status signals. In this case, handling of a final output signal FY is the same as in the second modification. That is, when the final output signal FY has the low voltage L, the control signal P is enabled and the first hydraulic circuit 320 is controlled based on the control signal P. Whereas when the final output signal FY has the high voltage H, the control signal P is disabled and the mode switching valve 550 is switched to operate in the bypass mode.

Figure 7:
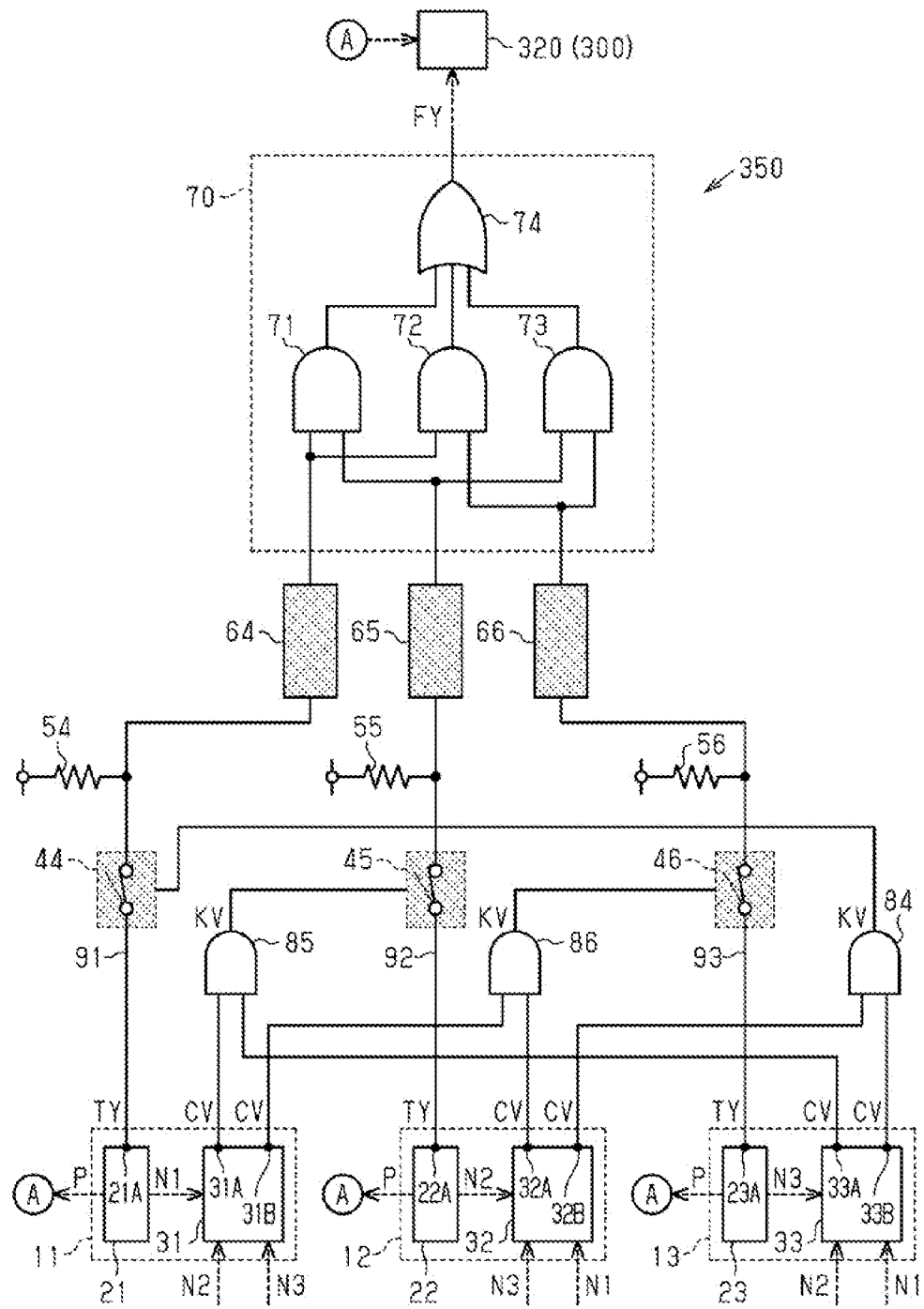
FIG. 7 schematically illustrates a modification example of the first redundancy control device.

When the comparison signal CV and the output signal TY are modified as described above, the circuit may be configured as a combination of the above two modification examples as shown in FIG. 7. That is, similar to the first modification, each switch control unit 84, 85, 86 is formed of the AND circuit, and each switch 44, 45, 46 is formed of the normally closed switch. Therefore, when at least one of the two comparison signals CV inputted to the switch control unit has the low voltage L indicating the match between the status signals, the switch control unit outputs the low voltage L as the switch signal KV to control the switch such that the switch becomes the connected state.

Whereas when both of the two comparison signals CV inputted to the switch control unit have the high voltage H indicating the mismatch between the status signals, the switch control unit outputs the high voltage H as the switch signal KV to control the switch such that the switch becomes the disconnected state.

Further, the pull-up resistors 54, 55, 56 are connected in the respective output lines 91, 92, 93 on the majority voting circuit 70 side of the switches as shown in FIG. 7. Further, each of the latch circuits 64, 65, 66 is configured to latch the high voltage H and continue to output the high voltage H when the high voltage H is inputted thereto. With this configuration, as explained in the second modification example, the high voltage H is supplied to the output line by the pull-up resistor when the output line is disconnected due to a failure of the controller, and the latch circuit latches the voltage H and continues to output the high voltage H. Thus, when the two output lines are disconnected in response to failure of the two corresponding controllers, at least these two output lines supply the high voltage H to the majority voting circuit 70. Then, the high voltage H is outputted from the majority voting circuit 70 as the final output signal FY. In this way, as in the above embodiment, the mode switching valve 550 can be switched to the bypass mode when the two controllers fail.

The configuration of the status signals is not limited to the example in the above embodiment. The status signals may be any calculation results obtained by executing the same processing by the three controllers 11, 12, 13. For example, the status signals may be current values for controlling the switching valves 550, 560 and the pump 570 in the first hydraulic circuit 320.

The comparison circuits 31, 32, 33 may transmit and receive the respective status signals at different timings.

When comparing the status signals in each of the comparison circuits 31, 32, 33, the value of the status signal may have a range with upper and lower limits. That is, the range may be defined from the upper limit which is a value larger than the value of the status signal of the own controller by an allowance value, to the lower limit which is a value smaller than the value of the status signal of the own controller by an allowance value. Then it may be determined whether a value of the status signal of the other controller is within the defined range. When other status signals are within the above range, it may be determined that the status signals match each other. The above allowable value may have a magnitude that can cover, for example, a calculation error related to the calculation of the status signal.

When comparing the status signals of each comparison circuit 31, 32, 33, the match or mismatch between the status signals may be determined within a predetermined time period instead of instantly determining the match or mismatch between the status signals. Specifically, it may be determined that the status signals do not match when the status signals do not match each other continuously during the above period. Whereas when the status signals do not match momentarily but the status signals match during the period, it may be determined that the status signals match each other.

Each comparison circuit 31, 32, 33 may be provided separately from the controller instead of being integrated in the controller.

An orifice that serves as a resistance for the flow of hydraulic fluid may be provided in the flow path of the mode switching valve 550 when the mode switching valve 550 is switched to the disconnected position 552.

During normal operation, both the first actuator 300 and the second actuator 400 may be controlled to the active mode. In this case, if two controllers in the first redundancy control device 350 fail, the first actuator 300 operates in the standby mode and just follows the flap 600. In this case, the flap 600 can be operated by driving the second actuator 400 and the aircraft can be steered as usual.

The moving surfaces driven by the first actuator 300 and the second actuator 400 are not limited to the flap 600. The moving surfaces driven by the first actuator 300 and the second actuator 400 may be, for example, an aileron or an elevator. It is not always necessary to use both the first actuator 300 and the second actuator 400 to drive the target moving surface, and the number of actuators may be appropriately changed according to the moving surface to be driven. Alternatively, the moving surface may be driven by three or more actuators.

The first redundancy control device 350 may be individually provided for each of the plurality of first actuators 300. Even in this case, the command signal S may be transmitted from the upper-level device 700 to each first redundancy control device 350 so that the plurality of first actuators 300 are all controlled in the same control mode. That is, all the first actuators 300 are synchronously controlled to operate in the active mode or the standby mode. Similar to the first actuators 300, the second redundancy control device 450 may be individually provided for each of the plurality of second actuators 400. Even in this case, the command signal S may be transmitted from the upper-level device 700 to each second redundancy control device 450 so that the plurality of second actuators 400 are all controlled in the same control mode.

The actuator that drives the moving surface is not limited to the electrohydraulic actuator. Alternatively, the moving surface may be driven by an electromechanical actuator. In the electromechanical actuator, an output rod is housed inside, for example, a circular cylinder and the output rod reciprocates therein. Further, the electromechanical actuator includes a motor that drives the rod and a conversion unit that converts a rotational motion of the motor into a linear motion. When the motor rotates, the rotation is transmitted to the rod in the cylinder as the linear motion via the conversion unit. When such an electromechanical actuator is controlled by the redundancy control device, the motor is stopped once the final output signal F indicating that two controllers have failed is outputted. In this case, the flap stops moving as the motor stops. Here, the conversion unit that converts the rotational motion of the motor into the linear motion is moved smoothly by the force inputted by the motor, but is difficult to be moved by the force inputted by the rod. That is, even if a flow of wind generated by the flight of the aircraft tries to move the flap, the rod does not move so the flap does not move. Therefore, the flap stays in a substantially same position. Consequently, it becomes easier to balance the flight with other moving surfaces.

What is claimed is:

1. A redundancy control device for an aircraft, comprising:

three controllers each outputting a first voltage or a second voltage different from the first voltage as an output signal to an actuator that drives a moving surface of an aircraft, each of the three controllers performing a same processing to obtain an operation result, each of the three controllers outputting the operation result as a status signal;

a comparison circuit provided for each of the three controllers, the comparison circuit outputting a comparison signal based on a comparison between the status signal outputted by a corresponding one of the three controllers and the status signal outputted by another of the three controllers;

a switch provided for each of three output lines, each of the three controllers being provided with a corresponding one of the three output lines through which the output signal is outputted by a corresponding one of the three controllers, the switch switching between connection and disconnection of a corresponding one of the three output lines;

a switch control unit provided for each switch, the switch control unit outputting a switch signal to the switch in response to the comparison signal from the comparison circuit;

a voltage supply unit connected to each of the three output lines downstream of the switch, the voltage supply unit supplying the second voltage to the output line when the first voltage from the controller is lost;

a latch circuit connected to the three output lines downstream of the voltage supply unit, the latch circuit latching the second voltage and keeping outputting the second voltage once the second voltage is inputted thereto; and a majority voting circuit connected to each of the three output lines downstream of the latch circuits, each of the output signals from the three controllers being inputted to the majority voting circuit through each corresponding one of the output lines, the majority voting circuit establishing a majority vote of the three output signals and outputting the first voltage or the second voltage as a final output signal, wherein the switch control unit outputs the switch signal to disconnect the switch provided in the output line of a first controller, which is a corresponding one of the three controllers when the comparison signals outputted by the comparison circuits of second and third controllers, which are the other two of the three controllers both indicate a mismatch between the first controller and the second and third controllers.

2. The redundancy control device for an aircraft according to claim 1, wherein the redundancy control device is applied to a plurality of fluid pressure actuators attached to a same moving surface of the aircraft, and the plurality of actuators are configured to be switched between an active mode where the actuators drive the moving surface and a standby mode where the actuators follow the moving surface without driving the moving surface.

3. The redundancy control device for an aircraft according to claim 2, wherein the plurality of actuators attached to the moving surface include one or more first actuators and one or more second actuators different from the first actuator, and one of the first actuator and the second actuator is controlled to operate in the active mode, and the other of the first actuator and the second actuator is controlled to operate in the standby mode.

4. The redundancy control device for an aircraft according to claim 1, wherein the redundancy control device is applied to an electromechanical actuator attached to a moving surface of the aircraft.

* * * * *